(12) United States Patent
Lee

(10) Patent No.: US 9,444,070 B2
(45) Date of Patent: Sep. 13, 2016

(54) ORGANIC LIGHT EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Hee-Kwon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 237 days.

(21) Appl. No.: 13/937,069

(22) Filed: Jul. 8, 2013

(65) Prior Publication Data
US 2014/0292184 A1 Oct. 2, 2014

(30) Foreign Application Priority Data
Mar. 27, 2013 (KR) .................. 10-2013-0032964

(51) Int. Cl.
*H05B 33/04* (2006.01)
*H01L 51/52* (2006.01)
*H01L 27/32* (2006.01)

(52) U.S. Cl.
CPC .......... *H01L 51/5246* (2013.01); *H01L 27/32* (2013.01)

(58) Field of Classification Search
CPC .... H01L 27/32; H01L 51/5246; H05B 33/04
USPC .................... 313/512, 511; 361/829
See application file for complete search history.

(56) References Cited

U.S. PATENT DOCUMENTS

| | | | |
|---|---|---|---|
| 2010/0103641 A1 | 4/2010 | Cho et al. | |
| 2012/0200796 A1 | 8/2012 | Harayama et al. | |
| 2013/0120227 A1* | 5/2013 | Tanikawa | 345/55 |
| 2013/0155004 A1* | 6/2013 | Yoshikawa | 345/174 |

FOREIGN PATENT DOCUMENTS

| | | |
|---|---|---|
| KR | 10-2010-0046478 A | 5/2010 |
| KR | 10-2012-0090846 A | 8/2012 |

* cited by examiner

*Primary Examiner* — Karabi Guharay
(74) *Attorney, Agent, or Firm* — Lewis Roca Rothgerber Christie LLP

(57) ABSTRACT

An organic light emitting display device includes: a cover window having a receiving recess, the receiving recess having a bottom surface and a side surface inclined with respect to the bottom surface; a display panel assembly in the receiving recess; an adhesive layer between the bottom surface and the display panel assembly and coupling the bottom surface to the display panel assembly; and a sealing part between the side surface and the display panel assembly to couple the side surface and the display panel assembly.

15 Claims, 5 Drawing Sheets

ORGANIC LIGHT EMITTING DISPLAY DEVICE AND METHOD OF MANUFACTURING THE SAME

CROSS-REFERENCE TO RELATED APPLICATION

This application claims priority to and the benefit of Korean Patent Application No. 10-2013-0032964, filed on Mar. 27, 2013, the entire disclosure of which is incorporated by reference herein.

BACKGROUND

1. Field

Aspects of the present invention relate to an organic light emitting display device and a method of manufacturing the same. More particularly, embodiments of the present invention relate to an organic light emitting display device having improved side-impact resistance and a method of manufacturing the organic light emitting display device.

2. Description of the Related Art

In general, an organic light emitting display device is a self-emissive display device. Therefore, as contrasted with a liquid crystal display device, an organic light emitting display device does not need to have a separate light source, and thus the thickness and weight of the organic light emitting display device are reduced when compared to those of a liquid crystal display device. In addition, organic light emitting display devices are spotlighted as a next generation display device because it has advantages such as low power consumption, high brightness, fast response speed, etc.

Generally, an organic light emitting display device includes a display panel assembly on which organic light emitting devices are disposed and a cover window disposed on the display panel assembly.

In such an organic light emitting display device, although the display panel assembly is designed to have a slim shape, the reduction in the thickness of the organic light emitting display device is limited by the thickness of the cover window.

In addition, the organic light emitting display device does not include a part for protecting the display panel assembly from side impacts, so that the organic light emitting display device is vulnerable to side impacts.

SUMMARY

Aspects of the present invention are directed to an organic light emitting display device capable of a reduced thickness and having improved side-impact resistance.

Aspects of the present invention provide a method of manufacturing the organic light emitting display device.

Embodiments of the present invention provide an organic light emitting display device including a cover window, a display panel assembly, a protective layer, an adhesive layer, and a sealing part.

According to one embodiment, the cover window has a receiving recess having a bottom surface and a side surface inclined with respect to the bottom surface.

According to one embodiment, the display panel assembly is in the receiving recess and includes a display panel and a touch panel and the display panel is configured to display an image, and the touch panel is disposed on the display panel and is configured to detect a touch event and to provide a touch coordinate to the display panel.

According to one embodiment, the protective layer faces the cover window and the display panel assembly is interposed between the protective layer and the cover window, thereby protecting a rear surface of the display panel assembly. The protective layer may be formed of a rubber material.

According to one embodiment, the adhesive layer is disposed between the bottom surface and the display panel assembly to couple the bottom surface and the display panel assembly.

According to one embodiment, the sealing part is disposed between the side surface and the display panel assembly to couple (or adhere) the side surface and the display panel assembly.

Embodiments of the present invention provide a method of manufacturing an organic light emitting display device, the method including forming an etch-resistance pattern on an upper surface of a window member, forming a lower etch-resistance film on a lower surface of the window member, etching the window member using the etch-resistance pattern and the lower etch-resistance film as an etch-protective layer to form a cover window having a receiving recess, forming an adhesive layer, a display panel assembly, and a protective layer in the receiving recess, and forming a sealing part between the display panel assembly and a side surface of the receiving recess.

The thickness of the organic light emitting display device may be reduced by the shape of the cover window in which the receiving recess is formed. In addition, because the sealing part is disposed between the side surface of the receiving recess and the display panel assembly, the display panel assembly may be protected from side impacts.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
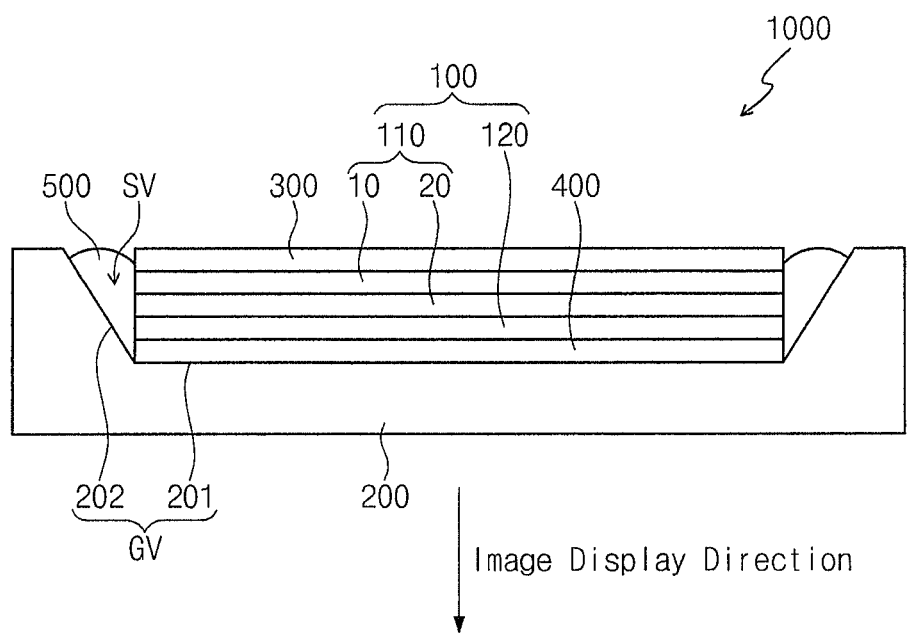
FIG. 1 is a cross-sectional view showing an organic light emitting display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a cross-sectional view showing an organic light emitting display device 1000 according to an exemplary embodiment of the present disclosure.

Referring to FIG. 1, the organic light emitting display device 1000 includes a display panel assembly 100, a cover window 200, a protective layer 300, an adhesive layer 400, and a sealing part 500.

The display panel assembly 100 includes a display panel 110 and a touch panel 120. Hereinafter, a front surface of the display panel assembly 100 is referred to as a light emitting surface and a rear surface of the display panel assembly 100 is referred to as an opposite surface.

The display panel 110 includes a first substrate 10 and a second substrate 20. The first substrate 10 includes a display area and a non-display area. An image is displayed in the display area and not displayed in the non-display area. The first substrate 10 includes a plurality of pixels arranged in the display area in the form of a matrix. In addition, the first substrate 10 may further include gate and data drivers to drive the pixels. The first substrate 10 may further include a pad electrode and an integrated circuit chip disposed in the non-display area. The integrated circuit chip is mounted on the first substrate 10 in a chip-on-glass (COG) manner and electrically connected to the pad electrode.

The second substrate 20 is coupled to the first substrate 10 to seal the pixels, circuits, and lines disposed on the first substrate 10 from the environment. The display panel 100 may further include a polarization film attached onto a surface of the second substrate 20 to reduce or to prevent an external light from being reflected.

The touch panel 120 is disposed on the second substrate 20 to detect a touch event and provides a coordinate related to the touch event (hereinafter, referred to as a touch coordinate) to the display panel 110. The touch panel 120 may be a resistive type of touch panel, a capacitive type of touch panel, an electromagnetic type of touch panel, etc. For instance, when the touch panel 120 is operated in the capacitive mode, the touch panel 120 includes sensing patterns and metal lines connected to the sensing patterns. The touch panel 120 detects variations in the capacitance of the sensing lines through the metal lines and calculates the touch coordinate on the basis of the capacitance variations.

The touch panel 120 has a film shape and is disposed between the display panel 110 and the cover window 200, thus allowing the thickness of the organic light emitting display device 1000 to be reduced.

The cover window 200 covers a front surface of the display panel assembly 100 that displays the image. The cover window 200 includes a receiving recess GV to accommodate the display panel assembly 100. The receiving recess GV includes a bottom surface 201 and a side surface 202 connected to (e.g., adjacent) the bottom surface 201. The side surface 202 is inclined (or slanted or at an angle) with respect to the bottom surface 201. The display panel assembly 100 is accommodated in the receiving recess GV and fixed to the cover window 200. The side surface 202 is spaced apart from the display panel assembly 100 because the side surface 202 is inclined with respect to the bottom surface 201. In addition, the angle of the side surface 202 provides a side recess SV between the side surface 202 and the display panel assembly 100.

The cover window 200 is formed of a transparent material, such as glass or plastic.

Due to the shape of the cover window 200 having the receiving recess GV, the thickness of the organic light emitting display device 1000 may be reduced. In a conventional organic light emitting display device, a cover window, an adhesive layer, a display panel assembly, and a protective layer are sequentially stacked without the receiving recess, but, in contrast, according to the present exemplary embodiment the adhesive layer 400, the display panel assembly 100, and the protective layer 500 are sequentially accommodated in the receiving recess GV formed in the cover window 200 in the organic light emitting display device 1000. As a result, the thickness of the organic light emitting display device 1000 may be reduced by a depth of the receiving recess GV when compared to that of a conventional organic light emitting display device.

The protective layer 300 is disposed to face the cover window 200 with the display panel assembly 100 interposed therebetween. The protective layer 300 is attached to the display panel assembly 100 to protect the rear surface of the display panel assembly 100 from external impact. The protective layer 300 is formed of a material having a strength weaker (e.g., a softer material) than that of the display panel assembly 100 or the cover window 200. That is, the protective layer 300 has strength weaker (e.g., a softer surface) than that of the display panel assembly 100 such that the rear surface of the display panel assembly 100 is not cracked. For instance, the protective layer 300 may be a sponge formed by foaming a rubber solution or a urethane formed by processing a rubber solution in a synthetic resin.

The adhesive resin 400 is disposed in the receiving recess GV to couple the display panel assembly 100 and the cover window 200. In more detail, the adhesive layer 400 is disposed between the bottom surface 201 and the display panel assembly 100 to couple the bottom surface 201 and the display panel assembly 100.

The adhesive layer 400 is formed of a transparent material. The adhesive layer 400 is formed by coating the transparent material in a liquid state and curing the coated transparent material, thereby coupling the display panel assembly 100 and the cover window 200. The adhesive layer 400 may have a relatively high elasticity. For instance, the adhesive layer 400 may be formed of a super view resin (SVR) or an optically clear adhesive (OCA). The adhesive layer 400 may prevent the display panel assembly 100 from being separated from the cover window 200 (e.g., the adhesive layer 400 attaches the display assembly 100 to the cover window 200) and protect the display panel assembly 100 from external impacts using the higher elasticity of the adhesive layer. Accordingly, mechanical stability and reliability of the organic light emitting display device 1000 may be improved by the adhesive layer 400.

The sealing part 500 is disposed between the side surface 202 and the display panel assembly 100 to couple the side surface 202 and the display panel assembly 100. According to one embodiment, the sealing part 500 is disposed in the side recess SV. The sealing part 500 protects the side surface of the display panel assembly 100 from external impacts. In addition, the sealing part 500 blocks contaminants from infiltrating into the display panel assembly 100 through the side recess SV.

The sealing part 500 may include a material cured by an ultraviolet ray. For instance, the sealing part 500 may a material of an acryl-based resin, but embodiment of the present invention are not be limited thereto or thereby. For example, the sealing part 500 may include a thermal-curable material or a natural-curable material. The natural-curable material may be a resin cured at room temperature without an ultraviolet ray and a thermal energy.

According to the organic light emitting display device 1000 in the embodiment shown in FIG. 1, the thickness of the organic light emitting display device 1000 may be reduced by the depth of the receiving recess GV formed in the cover window 200. In addition, because the side surface 202 of the receiving recess GV is inclined and the sealing part 500 is formed in (or deposited in) the side recess SV, the display panel assembly 100 may be protected from side impacts applied thereto.

FIGS. 2, 3, 4, and 5 are cross-sectional views showing various organic light emitting display devices according to exemplary embodiments of the present disclosure.

The organic light emitting display devices shown in FIGS. 2, 3, 4, and 5 have substantially the same structure and function as those of the organic light emitting display device shown in FIG. 1 except for the cover window. Thus, hereinafter only the cover window will be described in detail.

Figure 2:
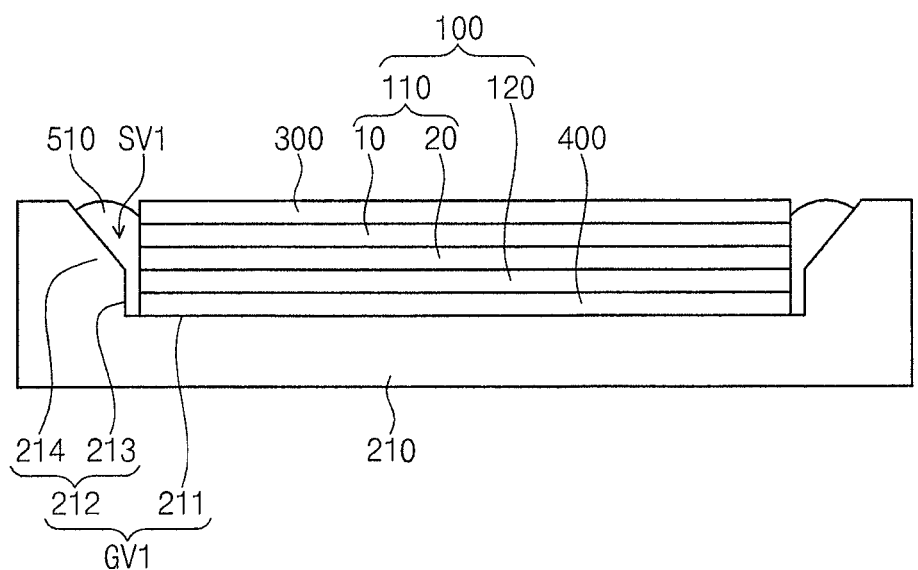
FIGS. 2, 3, 4, and 5 are cross-sectional views showing various organic light emitting display devices according to exemplary embodiments of the present disclosure.

Referring to FIG. 2, according to one embodiment, the organic light emitting display device includes a cover window 210. The cover window 210 covers the front surface of the display panel assembly 100, on which the image is displayed. The cover window 210 includes a receiving recess GV1 to accommodate the display panel assembly 100. The receiving recess GV1 includes a bottom surface 211 and a side surface 212 connected to the bottom surface 211. The side surface 212 includes a first side surface 213 and a second side surface 214.

The first side surface 213 is extended in a direction substantially vertical (or substantially perpendicular) to the bottom surface 211. The second side surface 214 is extended from the first side surface 213 and inclined (or angled) with respect to the bottom surface 211.

A side recess SV1 is defined between the side surface 212 and the display panel assembly 100 and a sealing part 510 is provided in the side recess SV1.

Figure 3:
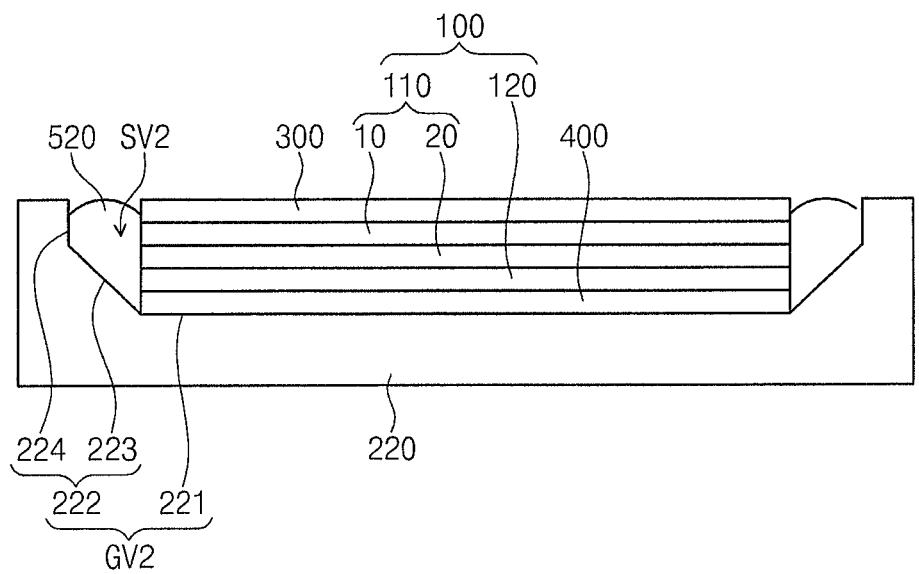

Referring to FIG. 3, according to one embodiment the organic light emitting display device includes a cover window 220. The cover window 220 covers the front surface of the display panel assembly 100, on which the image is displayed. The cover window 220 includes a receiving recess GV2 to accommodate the display panel assembly 100. The receiving recess GV2 includes a bottom surface 221 and a side surface 222 connected to the bottom surface 221. The side surface 222 includes a first side surface 223 and a second side surface 224.

The first side surface 223 is extended from the bottom surface 221 and inclined with respect to the bottom surface 221. The second side surface 224 is extended from the first side surface 223 in a direction substantially vertical (or substantially perpendicular) to the bottom surface 221.

A side recess SV2 is defined between the side surface 222 and the display panel assembly 100 and a sealing part 520 is provided in the side recess SV2.

Figure 4:
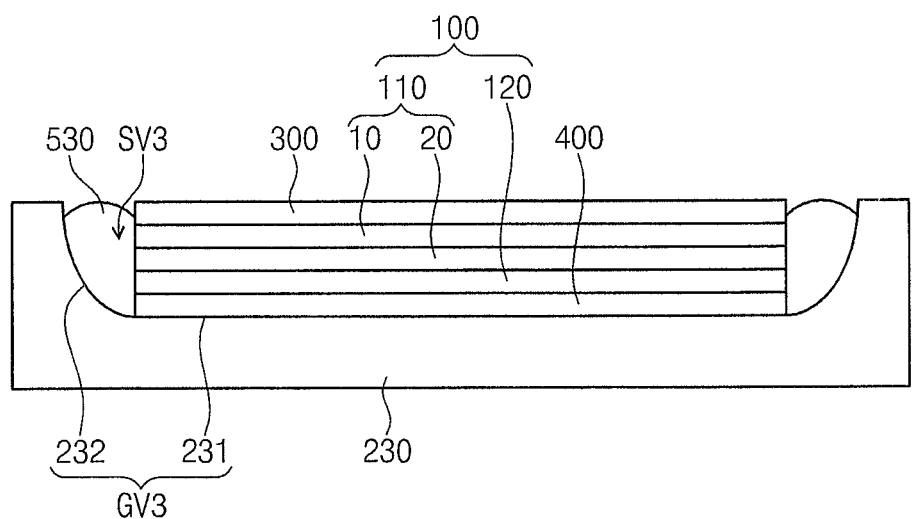

Referring to FIG. 4, according to one embodiment the organic light emitting display device includes a cover window 230. The cover window 230 covers the front surface of the display panel assembly 100, on which the image is displayed. The cover window 230 includes a receiving recess GV3 to accommodate the display panel assembly 100. The receiving recess GV3 includes a bottom surface 231 and a side surface 232 connected to the bottom surface 231. The side surface 232 is curved. An absolute value of a slope of the side surface 232 increases with distance from the bottom surface 231.

A side recess SV3 is defined between the side surface 232 and the display panel assembly 100 and a sealing part 530 is provided in the side recess SV3.

Figure 5:
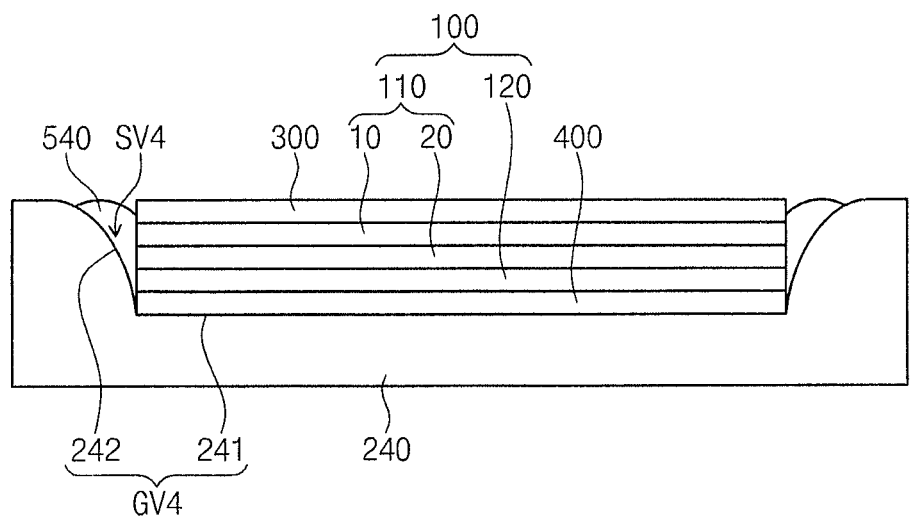

Referring to FIG. 5, according to one embodiment the organic light emitting display device includes a cover window 240. The cover window 240 covers the front surface of the display panel assembly 100, on which the image is displayed. The cover window 240 includes a receiving recess GV4 to accommodate the display panel assembly 100. The receiving recess GV4 includes a bottom surface 241 and a side surface 242 connected to the bottom surface 241. The side surface 242 is curved. An absolute value of a slope of the side surface 242 decreases with distance from the bottom surface 241.

A side recess SV4 is defined between the side surface 242 and the display panel assembly 100 and a sealing part 540 is provided in the side recess SV4.

FIGS. 6, 7, 8, 9, and 10 are cross-sectional views showing a method of manufacturing an organic light emitting display device according to an exemplary embodiment of the present disclosure.

Figure 6:
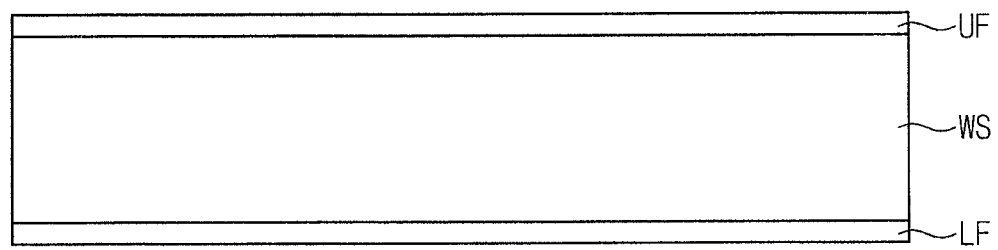
FIGS. 6, 7, 8, 9, and 10 are cross-sectional views showing a method of manufacturing an organic light emitting display device according to an exemplary embodiment of the present disclosure.

Referring to FIG. 6, a window member WS, which is integrally formed as a single unitary and individual unit, is prepared. The window member WS is formed of the transparent material such as glass or plastic.

An upper etch-resistance film UF is attached on an upper surface of the window member WS and a lower etch-resistance film LF is attached to a lower surface of the window member WS. The upper and lower etch-resistance films UF and LF protect the window member WS from etchant used in a wet etch process.

Figure 7:
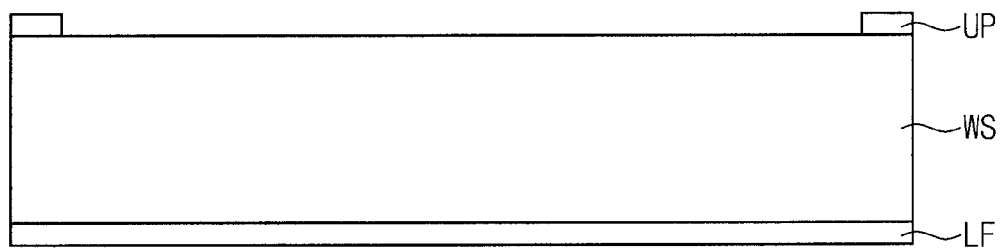

Referring to FIGS. 6 and 7, the upper etch-resistance film UF is partially removed by cutting away a portion thereof. In this case, an end (or edge) portion of the upper etch-resistance film UF remains on the window member WS and a center portion of the upper etch-resistance film UF is removed from the window member WS. The remaining upper etch-resistance film UF, i.e., the end (or edge) portion of the upper etch-resistance film UF, serves as an etch-resistance pattern UP, and a portion of the upper surface of the window member WS is exposed through the etch-resistance pattern UP.

Figure 8:
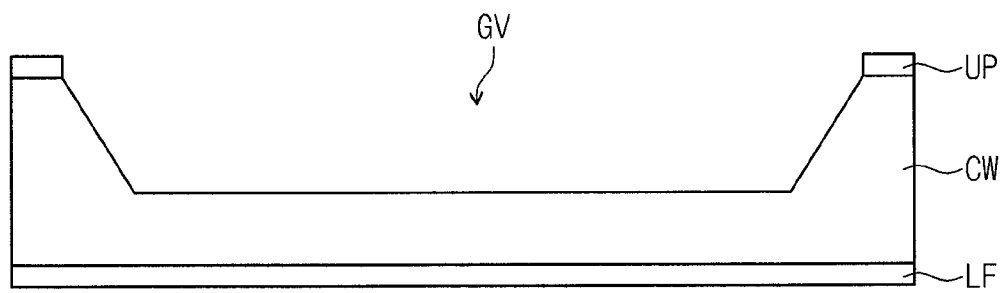

Referring to FIGS. 7 and 8, the window member WS is etched using the etch-resistance pattern UP and the lower etch-resistance film LF as an etch-protective layer. In this case, the window member WS is etched using a wet etch process with the etchant. The window member WS is etched to form the receiving recess GV therein. During the wet etch process, the window member WS is etched so that the side surface of the receiving recess GV is inclined (or angled) with respect to the bottom surface of the receiving recess GV. The slope of, the receiving recess GV is controlled by controlling the concentration of the etchant and the etching time.

As described above, the window member WS is etched to form the cover window CW in which the receiving recess GV is formed. Then, the etch-resistance pattern UP and the lower etch-resistance film LF respectively attached to the upper and lower surfaces of the cover window CW are removed.

Figure 9:
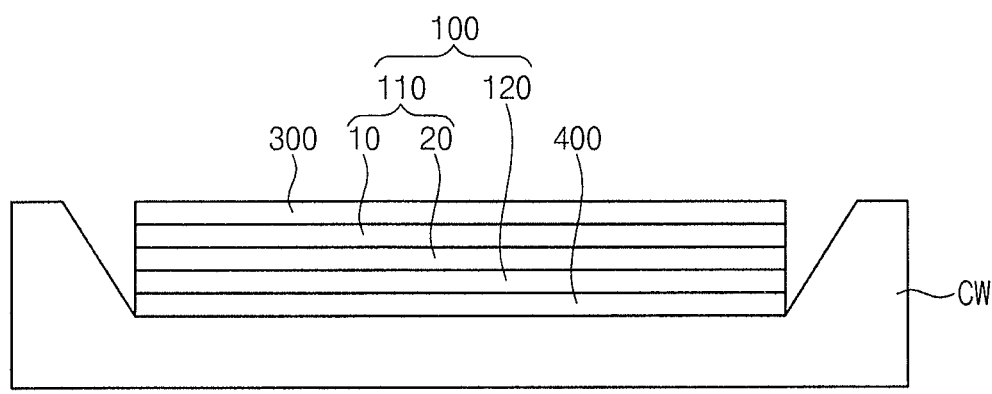

Referring to FIG. 9, the adhesive layer 400, the display panel assembly 100, and the protective layer 500 are sequentially formed in the receiving recess GV.

The first substrate 10 that includes the pixels formed thereon is coupled with the second substrate 20 that seals the first substrate 10, and thus the display panel 110 is formed. The touch panel 120 is attached to the display panel 110 to form the display panel assembly 100.

Then, a liquefied adhesive material is coated on the bottom surface of the receiving recess GV, and the display panel assembly 100 is adhered to the liquefied adhesive material. After that, the liquefied adhesive material is cured to form the adhesive layer 400.

The protective layer 500 is formed on the display panel assembly 100 using a rubber material.

The side recess (or side recesses) SV is defined between the receiving recess GV and the adhesive layer 400, the display panel assembly 100, and the protective layer 500.

Figure 10:
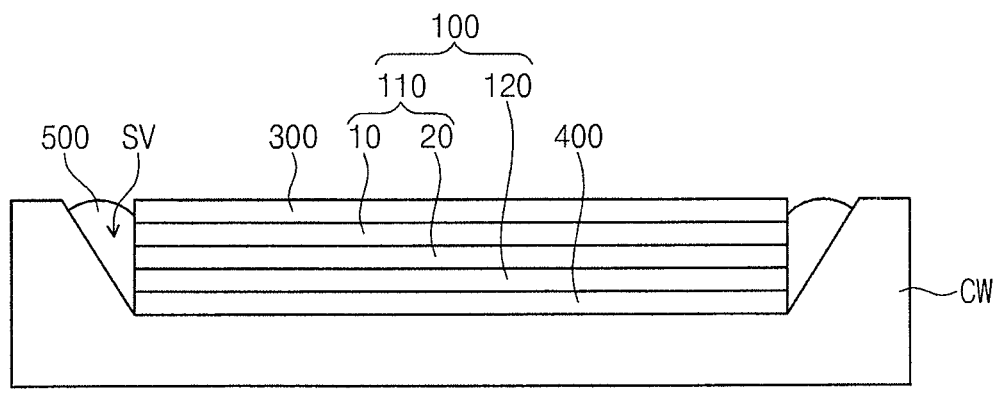

Referring to FIG. 10, the sealing part 500 is formed in the side recess SV. In more detail, the sealing part 500 is formed by coating a light-curable material in the side recess SV and irradiating the light-curable material using an ultraviolet ray to cure the light-curable material. The sealing part 500 attaches the display panel assembly 100 to the side surface of the receiving recess GV to protect the display panel assembly 100 from the side impacts.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed and equivalents thereof.

What is claimed is:

1. An organic light emitting display device comprising:
   a cover window having a first surface and a second surface, the first surface having a receiving recess and the second surface being a planar surface, the receiving recess having a bottom surface and a side surface inclined with respect to the bottom surface and the receiving recess having a depth;
   a display panel assembly in the receiving recess, the display panel assembly comprising:
     a first substrate having a pixel and a gate driver to drive the pixel; and
     a second substrate facing the first substrate;
   an adhesive layer between the bottom surface and the display panel assembly and coupling the bottom surface to the display panel assembly, the display panel assembly and the adhesive layer having a total thickness less than or equal to the depth of the receiving recess; and
   a sealing part between the side surface and the display panel assembly to couple the side surface and the display panel assembly.

2. The organic light emitting display device of claim 1, wherein the side surface extends from the bottom surface.

3. The organic light emitting display device of claim 1, wherein the side surface has:
   a first side surface extending in a direction substantially perpendicular to the bottom surface; and
   a second side surface extending from the first side surface and inclined with respect to the bottom surface.

4. The organic light emitting display device of claim 1, wherein the side surface comprises:
   a first side surface extending from the bottom surface and inclined with respect to the bottom surface; and
   a second side surface extending from the first side surface in a direction substantially perpendicular to the bottom surface.

5. The organic light emitting display device of claim 1, wherein the sealing part comprises a light-curable material, a thermal-curable material, or a natural-curable material.

6. The organic light emitting display device of claim 1, wherein the display panel assembly comprises:
   a display panel configured to display an image; and
   a touch panel on the display panel and configured to detect a touch event and to provide a touch coordinate to the display panel.

7. The organic light emitting display device of claim 1, further comprising a protective layer facing the cover window, the display panel assembly being interposed between the protective layer and the cover window.

8. The organic light emitting display device of claim 7, wherein the protective layer comprises a rubber material.

9. An organic light emitting display device comprising:
   a cover window having a first surface and a second surface, the first surface having a receiving recess, and the second surface being a planar surface, the receiving recess having a bottom surface and a side surface connected to the bottom surface, the side surface having a curved shape;
   a display panel assembly in the receiving recess, the display panel assembly comprising:
     a first substrate having a pixel and a gate driver to drive the pixel; and
     a second substrate facing the first substrate;
   an adhesive layer between the bottom surface and the display panel assembly and coupling the bottom surface to the display panel assembly, the display panel assembly and the adhesive layer having a total thickness less than or equal to the depth of the receiving recess; and a sealing part between the side surface and the display panel assembly to couple the side surface and the display panel assembly.

10. The organic light emitting display device of claim 9, wherein an absolute value of a slope of the side surface increases with distance from the bottom surface.

11. The organic light emitting display device of claim 9, wherein an absolute value of a slope of the side surface decreases with distance from the bottom surface.

12. A method of manufacturing an organic light emitting display device, comprising:

forming an etch-resistance pattern on an upper surface of a window member;

forming a lower etch-resistance film on a lower surface of the window member;

etching the window member using the etch-resistance pattern and the lower etch-resistance film as an etch-protective layer to form a cover window having a receiving recess having a depth;

forming an adhesive layer, a display panel assembly, and a protective layer in the receiving recess, the adhesive layer and the display panel assembly having a total thickness less than or equal to the depth of the receiving recess, the display panel assembly comprising:

a first substrate having a pixel and a gate driver to drive the pixel; and a second substrate facing the first substrate; and forming a sealing part between the display panel assembly and a side surface of the receiving recess, wherein a surface of the cover window opposite the bottom surface is exposed to the external environment.

13. The method of claim 12, wherein the side surface of the receiving recess is inclined with respect to the bottom surface of the receiving recess.

14. The method of claim 12, wherein the forming of the etch-resistance pattern on the upper surface of the window member comprises:

attaching an upper etch-resistance film on the upper surface of the window member; and removing a center portion of the upper etch-resistance film.

15. The method of claim 12, wherein the forming of the sealing part comprises:

coating a light-curable material in a side recess between the side surface of the receiving recess and the display panel assembly; and irradiating the light-curable material with an ultraviolet ray.

* * * * *